United States Patent
Simpson et al.

(10) Patent No.: US 7,011,574 B2
(45) Date of Patent: Mar. 14, 2006

(54) POLYELECTROLYTE DISPENSING POLISHING PAD

(75) Inventors: Alexander William Simpson, Wappingers Falls, NY (US); Ronald Joseph Schutz, Millbrook, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/996,669

(22) Filed: Nov. 24, 2004

(65) Prior Publication Data
US 2005/0153643 A1    Jul. 14, 2005

Related U.S. Application Data

(62) Division of application No. 10/067,587, filed on Feb. 4, 2002, now Pat. No. 6,841,480.

(51) Int. Cl.
*B24B 1/00* (2006.01)
(52) U.S. Cl. ............................................. 451/526
(58) Field of Classification Search ............. 451/41, 451/287, 526, 530, 533
See application file for complete search history.

(56) References Cited

U.S. PATENT DOCUMENTS

| | | | |
|---|---|---|---|
| 5,152,917 A | 10/1992 | Pieper et al. | |
| 5,342,419 A | 8/1994 | Hibbard | |
| 5,368,619 A | 11/1994 | Culler | |
| 5,378,251 A | 1/1995 | Culler et al. | |
| 5,733,176 A | 3/1998 | Robinson et al. | |
| 5,782,675 A | 7/1998 | Southwick | |
| 5,855,804 A | 1/1999 | Walker | |
| 5,876,490 A | 3/1999 | Ronay | |
| 5,897,426 A | 4/1999 | Somekh | |
| 5,919,082 A | 7/1999 | Walker et al. | |
| 5,958,794 A * | 9/1999 | Bruxvoort et al. | 438/692 |
| 5,968,280 A | 10/1999 | Ronay | |
| 5,972,124 A | 10/1999 | Sethuraman et al. | |
| 5,972,792 A | 10/1999 | Hudson | |
| 6,019,670 A | 2/2000 | Cheng et al. | |
| 6,638,143 B1 | 10/2003 | Wang et al. | |
| 6,677,239 B1 | 1/2004 | Hsu et al. | |
| 2003/0124959 A1 * | 7/2003 | Schroeder et al. | 451/41 |
| 2003/0181046 A1 * | 9/2003 | Sachan et al. | 438/690 |

* cited by examiner

*Primary Examiner*—Jacob K. Ackun, Jr.
(74) *Attorney, Agent, or Firm*—Slater & Matsil, L.L.P.

(57) ABSTRACT

A polyelectrolyte dispensing polishing pad, a process for its production and a method of polishing, e.g., chemical mechanical polishing (CMP), a substrate such as a semiconductor wafer, are provided. The pad is usable for CMP planarization of an oxide or metal layer on the wafer. The pad has a polishing layer of erodible binder material containing uniformly distributed therein both abrasive particles and a water soluble ionizable electrolyte substance such as a polyelectrolyte, such that during polishing the binder material incrementally erodes and the abrasive particles and electrolyte substance incrementally release into direct contact with the substrate. The electrolyte substance inhibits CMP removal of silicon nitride, e.g., as a stop layer, under an upper oxide or metal layer, such that the upper layer is selectively polished and the CMP stops on the stop layer leaving the latter intact.

20 Claims, 1 Drawing Sheet

POLYELECTROLYTE DISPENSING POLISHING PAD

This application is a divisional of patent application Ser. No. 10/067,587, entitled "*Polyelectrolyte Dispensing Polishing Pad, Production Thereof and Method of Polishing a Substrate,*" filed on Feb. 4, 2002, now U.S. Pat. No. 6,841,480 which application is incorporated herein by reference.

This invention relates to a polyelectrolyte dispensing polishing pad, a process for its production, and a method of polishing, e.g., chemical mechanical polishing (CMP), a substrate such as a semiconductor wafer, e.g., of silicon (Si), and more particularly, to a polishing pad containing a releasable electrolyte substance such as a polyelectrolyte, usable for CMP planarization of an oxide layer, or of a metal layer, in preference to a silicon nitride layer, on the substrate.

As used herein, "semiconductor wafer" means any microelectronic device, chip or the like, e.g. of silicon, used to provide an integrated circuit (IC) or other related circuitry structure, subject to chemical mechanical polishing procedures for achieving planarization over an entire surface of the wafer.

BACKGROUND OF THE INVENTION

In fabricating micro-electronic semiconductor device components and the like on a semiconductor wafer (chip), e.g., of silicon (Si), to form an integrated circuit (IC), etc., various conductive, e.g., metal or poly silicon, layers and dielectric (insulation), e.g., oxide, layers are provided in selective sequence on the wafer. To maximize device component integration (connection) in the available wafer area to fit more components in the same area, increased IC miniaturization is utilized. Reduced pitch dimensions permit denser packing of components per very large scale integration (VLSI) technique, e.g., at sub-micron dimensions, i.e., below 1 micron ($\frac{1}{25}$, 400 inch) or 1,000 nanometers (nm) or 10,000 angstroms (A), and especially per ultra large scale integration (ULSI) technique, e.g., at sub-quarter micron dimensions, i.e., below 0.25 micron (250 nm).

One type of wet chemical planarization process used in the IC fabrication of a semiconductor wafer, or for planarizing any particular substrate as work piece, concerns the chemical mechanical polishing (CMP) of a surface of the work piece against a polishing pad during relative periodic movement, i.e., frictional sliding contact, therebetween, such as with a caustic (basic pH, e.g., pH 7.5–14) slurry for oxide CMP, or an oxidizing (acidic pH, e.g., pH 1–6.5) slurry for metal CMP. The slurry typically contains finely divided abrasive particles, e.g., colloidal silica ($SiO_2$), alumina ($Al_2O_3$), ceria ($CeO_2$), zirconia ($ZrO_2$), titania ($TiO_2$), and rare earth oxides other than ceria, and the like, in a polishing liquid such as deionized water.

The slurry is typically a suspension of such abrasive particles in a polishing liquid such as an aqueous potassium hydroxide (KOH) solution where the polishing liquid is of basic pH, or such as an aqueous sulfuric acid ($H_2SO_4$) solution where the polishing liquid is of acidic pH. The slurry can contain other components such as electrolyte substances, e.g., electrolytes, i.e., (i) inorganic electrolytes and (ii) organic electrolytes, as well as (iii) polyelectrolytes, to enhance the CMP operation, e.g., to facilitate removal of polishing debris particles, i.e., swarf, generated during the planarizing.

On the one hand, electrolytes are substances that dissociate into ions in water, and include (i) inorganic electrolytes and (ii) organic electrolytes. (i) Inorganic electrolytes are water soluble ionizable salts of inorganic acids and bases such as water soluble alkali metal (e.g., sodium, potassium, lithium and cesium), alkaline earth metal (e.g., calcium, magnesium, strontium and barium), and ammonium, salts, including water soluble halides (i.e., chlorides, bromides, iodides and fluorides), nitrates, sulfates (i.e., excluding water insoluble sulfates such as calcium sulfate, barium sulfate and strontium sulfate), and the like, thereof. (ii) Organic electrolytes are water soluble ionizable organic compounds such as amino acids, amines, amides, pyridinium halides (e.g., chloride), ethylene glycols, ethylene oxides, and the like.

On the other hand, (iii) polyelectrolytes are polymers producing large chain type ions in solution, that can carry positive or negative groups along the polymer chain, and are described more fully hereinafter.

The frictional sliding contact polishing action between the polishing pad and wafer (or other substrate) serves to remove by a combination of chemical etching and mechanical abrasion or erosion a thin layer of material, e.g., 1 micron or less in thickness, so as to obtain planarization of the wafer (or other substrate) surface. Close control of the slurry flow rate, its concentration, temperature and pH are necessary to attain in a reproducible manner a uniform removal rate per the CMP operation.

The usual CMP process involves dispensing the slurry from a stationary overlying tube dropwise onto a polishing pad of a moving, e.g., rotating, table (platen), such as one which rotates about a stationary platen axis and against which the work piece, e.g., wafer or other substrate, which-is usually carried by a retaining ring, makes frictional contact while the work piece and ring move, e.g., rotate and oscillate, relative to the platen. The work piece is normally positioned in a medial aperture of the retaining ring. Since the position of the work piece relative to the platen varies during wafer movement, e.g., rotation and oscillation, the slurry dispensing tube is always spaced a minimum clearance distance from the work piece.

Consequently, different portions of the wafer or other substrate necessarily encounter dispensed slurry droplets having different chemical constitution. This depends on the continuously varying distance between the relative position of movement, e.g., rotation and oscillation, of the wafer or other substrate, i.e., as work piece, and in particular of its leading and trailing edges during movement, e.g., oscillation, and the position of the, e.g., centrifugally outwardly, travelling slurry droplets dispensed onto the, e.g., rotating, platen from the stationary tube. As a result, the amount and chemical constitution of the slurry at the local polishing site of the wafer or other substrate work piece is inherently non-uniform, leading to non-uniformity of the CMP operation.

Also, some slurry on the polishing pad is pushed off the platen by the retaining ring and wafer or other substrate work piece arrangement, which is normally pressed under mechanical pressure (down force) against the polishing pad. This loss of slurry constitutes wastage which increases operating costs. By its continuous sliding contact relation with the polishing pad, the wafer or other substrate work piece necessarily impedes flow of slurry to the central area of the surface thereof being polished. This can cause poor center-to-edge uniformity, further detracting from the uniformity of the CMP operation.

Moreover, since the slurry constitutes a physical suspension of solid abrasive particles in a liquid, its components must be premixed in a storage vessel or freshly mixed immediately prior to delivery onto the polishing pad, so as to provide the abrasive particles in desired uniform suspension therein. If the components are premixed, the storage lifetime of the slurry is a limiting factor, especially due to the potential vulnerability of the slurry to agglomeration of the abrasive particles, e.g., of ceria, with other components in the slurry, e.g., electrolytes or polyelectrolytes. On the other hand, if the components are freshly mixed immediately prior to delivery onto the polishing pad, the system must include sophisticated pumps to meter the slurry in a precisely controlled flow.

The above prior art drawbacks cause adverse variation in the local removal rate of wafer or other substrate work piece material from different parts of the work piece due to variation in the amount and chemical constitution of the slurry coming into contact with the work piece surface being polished. This diminishes the degree of within-work piece uniformity. Also, slurry wastage increases its consumption rate and cost.

Some of these drawbacks are overcome by providing the polishing pad as a fixed abrasive pad in which the abrasive particles are embedded, being distributed in a binder material as matrix, e.g., a cured polymer resin, such that the polishing liquid forms a slurry-less liquid which only contains chemical components such as caustic (basic) or oxidizing (acidic) additives, plus auxiliary components such as electrolytes or polyelectrolytes. Slurry-less CMP is effected such that during frictional sliding contact between the wafer or other substrate work piece and polishing pad under the lubricating action of the slurry-less polishing liquid and the down force of the work piece against the polishing pad, the binder material incrementally breaks down (abrades, erodes) and incrementally releases the embedded abrasive particles for direct polishing action thereat.

However, even in the case of slurry-less CMP, the chemical components in the polishing liquid are prevented from immediately and uniformly contacting the work piece surface being polished. This is because the flow of slurry-less polishing liquid is dispensed from a stationary location onto the moving, e.g., rotating, polishing pad and can only contact the surface of the work piece being polished when the moving, e.g., rotating and reciprocating, work piece reaches the point on the polishing pad at which the particular polishing liquid droplets are located.

Moreover, since the wafer or other substrate work piece is maintained in continuous frictional sliding contact with the polishing pad, only a portion of the deposited slurry-less polishing liquid droplets can pass under the work piece in the interface area between the work piece surface being polished and the polishing pad, and then only non-uniformly. This results in less efficient use of the available slurry-less polishing liquid, including the contemplated electrolyte or polyelectrolyte, and in turn increased wastage thereof.

Since the CMP operation generates contaminating debris particles constituting a combination of particles of abraded portions of the wafer or other substrate surface being polished, particles of abraded portions of the binder material of the slurry-less fixed abrasive particle polishing pad, and spent abrasive particles released from the binder material of the polishing pad and fractured and abraded under the CMP conditions, the excess polishing liquid cannot be recycled as is, nor would its purification to remove such contaminants be practicable.

Some examples of polishing pads and their production and CMP use are shown in the following prior art.

[1] U.S. Pat. No. 5,876,490, issued Mar. 2, 1999 to Ronay ("[1] Ronay-490"), which is incorporated by reference herein, discloses a polishing slurry, e.g., for CMP, containing colloidal (e.g., 30–200 nm, preferably 75–100 nm, particle size) abrasive particles, e.g., of silica ($SiO_2$), alumina ($Al_2O_3$), zirconia ($ZrO_2$) or ceria ($CeO_2$), and 5–10% (of the weight of the abrasive particles) of a polyelectrolyte adsorbed on a fraction of the abrasive particles and having ionic moieties different from the ionic charge associated with the abrasive particles. The slurry is used to polish $SiO_2$ (i.e., on a semiconductor wafer) such as for achieving planarity in regard to shallow trench isolation (STI), in connection with a polishing pad maintained in moving contact with the wafer.

Polyelectrolytes are noted as substances that contain poly ions, which are macro-molecules having a large number of ionic groups, and to preserve their electro-neutrality, the poly ion charges must be compensated by counter ions, typically ions of low molecular weight such as $H^+$ or $Na^+$. Unlike most uncharged polymers, polyelectrolytes usually are soluble in polar solvents, e.g., water. As to their protonation equilibria in aqueous solution, they can be classified as polyacids, as polybases, or as polyampholytes if both acidic and basic groups are present.

Per [1] Ronay-490, the ionizable or anchoring groups by which the poly ions can be bound to the polishing abrasive particles include acidic groups such as carboxyl groups, e.g., in poly(acrylic acid), poly(methacrylic acid), poly(methyl methacrylic acid), poly(maleic acid), or saturated or unsaturated poly(carboxylic acids); and basic groups including nitrogen containing groups, such as polymers with amino, amide, imide, vinyl pyridine, piperidine and piperazine derivatives, e.g., poly(ethylenimine). Particular ionizable chain molecules contemplated include (e.g., where the monomer unit n=5–200):

| | |
|---|---|
| 1. poly (acrylic acid) | $[-CH_2-CH(COOH)-]_n$ |
| 2. poly (methacrylic acid) | $[-CH_2-CH(CH_3)(COOH)-]_n$ |
| 3. poly (vinyl sulfonic acid) | $[-CH_2-CH(SO_3H)-]_n$ |
| 4. poly (acrylic acid-co-maleic acid) | $[-CH_2-CH(COOH)-CH(COOH)-CH(COOH)-]_n$ |
| 5. poly (vinyl amine) | $[-CH_2-CH(NH_2)-]_n$ |
| 6. poly (ethylenimine) | $[-CH_2-CH_2-NH-]_n$ |
| 7. poly (4-vinyl pyridine) | $[-CH_2-CH(4-C_5H_4N)-]_n$ |

[2] U.S. Pat. No. 5,968,280, issued Oct. 19, 1999 to Ronay ("[2] Ronay-280"), which is incorporated by reference herein, discloses the use of a post-CMP cleaning composition, e.g., aqueous solution, containing, e.g., 0.02–2.0% based on the total composition, of a polyelectrolyte, for cleaning a substrate surface (e.g., of a semiconductor wafer) after it has been subjected to CMP, e.g., with a polishing slurry of colloidal abrasive particles, such as alumina, silica, zirconia or ceria, so as to remove contaminant particles such as polishing debris particles from the surface. The polyelectrolyte adsorbs, typically by chemisorption, i.e., electron transfer, on the surface of the particles to be removed and also on the substrate surface, which enhances electrostatic repulsion between the particles and the wafer surface.

Per [2] Ronay-280, preferred polyelectrolytes are of relatively low molecular weight, typically less than about 100,000, such as 500–10,000, and include a charge-producing functional group. Like said [1] Ronay-490, [2] Ronay-280 indicates that polyelectrolytes contain poly ions, which are macro-molecules having a large number of ionizable groups, and to preserve the electro-neutrality of the polyelectrolyte substance, the poly ion charges must be compensated by counter ions, typically ions of low molecular weight such as $H^+$, $Na^+$, $K^+$ or $NH_4^+$. Unlike most uncharged polymers, polyelectrolytes usually are soluble in polar solvents such as water. With regard to their protonation equilibria in aqueous solution, they can be classified as polyacids, as polybases, or as polyampholytes if both acidic and basic groups are present.

Hence, they can contain acidic groups such as carboxyl groups, e.g., poly(acrylic acid), poly(methacrylic acid), poly(methyl methacrylic acid), poly(maleic acid), poly(acrylic acid-co-maleic acid), or saturated or unsaturated poly (carboxylic acids). Also, phosphoric acid and/or sulfonic acid groups can be incorporated into a polymer and may act as acidic functional groups, e.g., per poly(vinyl sulfonic acid). The polyelectrolyte can contain basic groups including nitrogen containing groups, such as polymers with amino, amide, imide, vinyl pyridine, piperidine and piperazine derivatives, e.g., per poly(vinyl amine), poly(ethylenimine), and poly(4-vinyl pyridine). Salts and esters of the foregoing are also contemplated.

Besides the particular compounds 1. to 7. noted in said [1] Ronay-490, per [2] Ronay-280, the following further compounds are contemplated, wherein the repeat number n of the monomer unit is preferably 5–200, and Y is $OC_1$-$C_4$ alkyl (i.e., alkoxy of 1–4 C-atoms), $OH^-$ or alkali metal ion such as said $Na^+$, $K^+$ and $NH_4^+$ ion.

8. salts or esters of poly(acrylic acid)

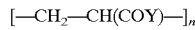

9. salts or esters of poly(methacrylic acid)

[3] U.S. Pat. No. 6,019,670, issued Feb. 1, 2000 to Cheng et al. ("[3] Cheng-670"), which is incorporated by reference herein, discloses a CMP apparatus including a carrier for mounting a substrate (i.e., a semiconductor wafer) to be polished, and an opposing polishing pad maintained in moving contact with the wafer mounted on the carrier, e.g., under an applied down force of 2–10 psi, while the carrier and polishing pad are each rotated at 30–200 rpm. The polishing pad is periodically conditioned, i.e., to remove collected debris (glazing) therefrom consequent CMP of such wafers, e.g., using a slurry containing a reactive agent (e.g., deionized water for oxide polishing), abrasive particles (e.g., silicon dioxide for oxide polishing) and a chemically reactive catalyzer (e.g., potassium hydroxide for oxide polishing).

The polishing pad can be a two layer pad in which the upper layer is harder than the lower layer and can be a fixed abrasive pad or a non-fixed abrasive pad. If it is a non-fixed abrasive pad, typically the upper layer-is composed of polyurethane mixed with a filler material and is about 50 mils thick, while the lower layer is composed of compressed felt fibers leached with urethane and also about 50 mils thick. On the other hand, if the polishing pad is a fixed abrasive pad, typically the upper layer is a 5–200 mil thick abrasive composite layer composed of abrasive grains held in a binder material, while the lower layer is a 25–200 mil thick backing layer composed of polymeric film, paper, cloth, a metallic film, or the like.

Said [3] Cheng-670 notes that fixed abrasive polishing pads are described in [4] U.S. Pat. No. 5,152,917, issued Oct. 6, 1992 to Pieper et al. ("[4] Pieper-917"); [5] U.S. Pat. No. 5,342,419, issued Aug. 30, 1994 to Hibbard ("[5] Hibbard-419"); [6] U.S. Pat. No. 5,368,619, issued Nov. 29, 1994 to Culler ("[6] Culler-619"); and [7] U.S. Pat. No. 5,378,251, issued Jan. 3, 1995 to Culler et al. ("[7] Culler-251"); which are discussed below.

[4] U.S. Pat. No. 5,152,917, issued Oct. 6, 1992 to Pieper et al. ("[4] Pieper-917"), which is incorporated by reference herein, discloses a coated abrasive article in the form of a backing, e.g., of polymeric film such as polyester film, or of a paper, cloth, metallic film, vulcanized fiber, and/or nonwoven, substrate, bearing abrasive composites of abrasive grains dispersed in a binder serving as medium for dispersing the abrasive grains and for bonding the abrasive composites to the backing. The abrasive grains include, e.g., aluminum oxide, silicon carbide, alumina zirconia, garnet, diamond and cubic boron nitride, e.g., of 0.5–1000, preferably 1–100, micron particle size. The abrasive composites have a predetermined, e.g., pyramid, prism, curvi-linear or saw toothed, shape and are disposed in a predetermined array having a non-random, e.g., repetitive, pattern.

The coated abrasive article is prepared by providing a slurry, e.g., preheated to 40–90° C., of a mixture of a radiation curable or gellable binder and the abrasive grains on the backing located on a production tool, so as to form such abrasive composites of the desired predetermined shape, and at least partially curing or gelling the binder by radiation energy before removing the backing from the production tool, and finally curing the binder, i.e, polymerizing the binder to solid state. The polymeric film forming the backing can be primed with a material such as polyethylene acrylic acid to promote adhesion of the abrasive composite thereto (col. 4, lines 13–22).

Usable binders include phenolic resins, amino plast resins, urethane resins, epoxy resins, acrylate resins, acrylated isocyanurate resins, urea-formaldehyde resins, isocyanurate resins, acrylated urethane resins, acrylated epoxy resins, and/or glue. Particular usable curable binder resins are enumerated (col. 5, line 3, to col. 6, line 20; col. 10, lines 1–24; and col. 11, lines 3–30). The weight ratio of abrasive grains to binder is about 4-1, preferably 3-2, parts abrasive grains to 1 part binder.

As the coated abrasive article is used to erode a surface, the composite breaks down revealing unused abrasive grains, i.e., the abrasive grains are sloughed off and new abrasive grains are exposed. The spaces between the abrasive composites provide means for escape of the swarf (i.e., material removed from the work piece being abraded) from the abrasive article, thereby reducing loading and the amount of heat build up during use.

[5] U.S. Pat. No. 5,342,419, issued Aug. 30, 1994 to Hibbard ("[5] Hibbard-419"), which is incorporated by reference herein, discloses an abrasive composite of (e.g., about 20–95%) abrasive particles in a binder (e.g., about 3–78%, of cured, gelled or polymerized) addition polymerized resin having (e.g., about 1–50%) clay particles dispersed therein. The composite is adhered to a substrate, i.e., backing, such as a paper, cloth, polymeric film or nonwoven backing. The clay particles allow the binder, and thus the composite, to erode controllably upon abrasion of a work piece and expose fresh abrasive particles.

Usable binders include ethylenically unsaturated resins such as acrylated urethane resins, styrene, divinyl benzene, vinyl toluene, amino plast resins having pendant unsaturated carbonyl groups, isocyanurate resins having at least one pendant acrylate group, and isocyanate resins having at least one pendant acrylate group, including a combination of the triacrylate of tris (hydroxy ethyl)isocyanurate and trimethylol as well as epoxy resins. Particular usable resins, including acrylate reactive diluents, are enumerated along with usable polymerization initiators (col. 4, lines 11–32; col. 4, line 60, to col. 5, line 8; col. 8, lines 34–46; col. 10, line 31, to col. 13, line 25; and col. 20, lines 20–25).

[6] U.S. Pat. No. 5,368,619, issued Nov. 29, 1994 to Culler ("[6] Culler-619"), which is incorporated by reference herein, discloses abrasive articles made from slurries of a binder precursor, i.e., polymerizable (curable) resin such as an addition polymerizable resin, abrasive particles and sufficient modifying silica particles to reduce the slurry viscosity.

Usable addition polymerizable resins include styrene, divinyl benzene, vinyl toluene and amino plast resins having pendant unsaturated carbonyl groups, isocyanurate resins having at least one pendant acrylate group, acrylated urethane resins, epoxy resins, and isocyanate derivatives having at least one pendant acrylate group, and especially wherein the isocyanurate resin having at least one pendant acrylate group is the triacrylate of tris(hydroxy ethyl)isocyanurate dissolved in trimethylol propane triacrylate. A reactive diluent can also be present including N-vinyl pyrrolidone, hexane diol diacrylate, triethylene glycol diacrylate, and trimethylol propane triacrylate (col. 9, line 57, to col. 10, line 13), plus a filler including sodium sulfate (col. 14, lines 1–10). Particular usable binder precursors (curable resins) are enumerated along with usable polymerization initiators (col. 7, line 54, to col. 11, line 40; and col. 18, line 10, to col. 19, line 35).

[7] U.S. Pat. No. 5,378,251, issued Jan. 3, 1995 to Culler et al. ("[7] Culler-251"), which is incorporated by reference herein, discloses an abrasive article formed of a backing on which an adhesive coating is bonded, the coating comprising a homogeneous mixture of abrasive particles, a binder, i.e., an organic polymerizable resin such as one comprised of polymer units of trimethylol propane triacrylate and a triacrylate of tris(hydroxy ethyl)isocyanurate, which serves to bond the coating to the backing, and a grinding aid consisting of a halide salt such as cryolite or potassium tetrafluoroborate as well as sodium chloride, potassium chloride and magnesium chloride, and an organic halide compound such as polyvinyl chloride (col. 8, lines 30–43). Particular usable binder resins are enumerated along with usable polymerization initiators (col. 5, line 34, to col. 8, line 4; col. 11, lines 20–46; and col. 15, lines 9–33).

[8] U.S. Pat. No. 5,958,794, issued Sep. 28, 1999 to Bruxvoort et al. ("[8] Bruxvoort-794"), which is incorporated by reference herein, discloses comprehensively the CMP of a semiconductor wafer surface, e.g., of silicon dioxide, by moving contact with a fixed abrasive article, e.g., a polishing pad, which can be erodible, and which has a three dimensional textured abrasive surface that includes a plurality of abrasive particles and a binder in a predetermined pattern. The CMP is effected in the presence of a liquid having a pH of at least 5 such as water, e.g., an aqueous medium containing a metal hydroxide such as potassium hydroxide, sodium hydroxide, or ammonium hydroxide, or a basic compound such as an amine, where the wafer surface being polished contains a metal oxide such as silicon dioxide (col. 12, lines 38–62), and which may contain additives such as lubricants including glycol ethers, glycerine, polyvinyl acetate, polyvinyl alcohols, and ethylene oxide polymers, (col. 13, lines 23–30).

The fixed abrasive article has a backing such as a polymer film, with a surface comprising such abrasive particles, e.g., of ceria, etc. (col. 19, lines 14–30) and a binder in the form of an abrasive coating. The binder can be a thermoset organic polymer resin, and particularly an acrylate or methacrylate polymer resin, and can contain, e.g., 25–75% of, a plasticizer, such as a phthalate ester or derivative thereof, and particularly polyethylene glycol, polyvinyl chloride, dibutyl phthalate, polyvinyl acetate, and polyvinyl alcohol (col. 27, lines 48–67), to increase the erodibility of the fixed abrasive article. The binder can also be in the form of a ceramer binder that includes colloidal metal oxide particles in an organic polymer resin (col. 2, lines 58–60).

Additives can be included in the binder resin such as a surfactant, e.g., polyalkylene oxide (col. 20, line 66, to col. 21, line 10); a filler, e.g., a metal sulfate such as sodium sulfate (col. 21, lines 46–61), or a halide salt such as sodium chloride, potassium chloride or magnesium chloride (col. 22, lines 8–12); an emulsifier such as a quaternary ammonium salt or triethyl amine (col. 25, lines 24–28); expanding agents such as ammonium bicarbonate, sodium bicarbonate, dinitro penta methylene tetramine, or azodicarbonamide (col. 29, lines 42–45); and lubricants such as glycol ethers or glycerine (col. 30, lines 1–4).

Particular usable binder resins and ceramer binders are enumerated along with usable plasticizers and polymerization initiators (col. 2, lines 56–67; col. 22, line 64, to col. 29, line 21; col. 30, line 28, to col. 34, line 5; and cols. 45–47).

[9] U.S. Pat. No. 5,733,176, issued Mar. 31, 1998 to Robinson et al. ("[9] Robinson-176"), which is incorporated by reference herein, discloses a polishing pad for CMP formed of a molded elastomeric substance with a polishing surface and having voids and optional abrasives, e.g., silica, ceria or zirconia, incorporated therein. The voids are located beneath the polishing surface and contain an end point indicator substance, i.e., a fluid, for producing a detectable signal as abrading of the elastomeric substance, e.g., against a semiconductor wafer, releases the end point indicator, whereby to indicate a worn out polishing pad.

Usable indicator substances in the voids include a color indicator dye, a sound indicator gaseous fluid, e.g., air, a pH indicator fluid, an electrical conductivity indicator fluid, a metal contaminant concentration indicator fluid, a friction coefficient indicating lubricant fluid, and a temperature indicator elastomeric substance.

[10] U.S. Pat. No. 5,855,804, issued Jan. 5, 1999 to Walker ("[10] Walker-804"), which is incorporated by reference herein, discloses a method and apparatus for forming a planar surface on a semiconductor wafer at a desired end point by removing material from the wafer with an abrasive medium, such that as the material is removed, the abrasive medium is inhibited from contacting a first exposed area at the desired end point on the wafer while it still contacts a second area thereon that is not yet at the end point, for continuing the polishing at the second area after the polishing has stopped at the first area.

In particular, the wafer has a hydrophobic stratum and a hydrophilic cover layer on the hydrophobic stratum, with a portion of the hydrophobic stratum being at a level proximate to the desired end point. The step of removing material from the wafer involves pressing the hydrophilic cover layer against a hydrophobic planarizing surface of a polishing pad in the presence of an abrasive slurry and under relative motion between the wafer and pad, while the step of inhibiting contact between the abrasive medium and the first area includes exposing the hydrophobic stratum at the first area to the hydrophobic planarizing surface of the pad such that the hydrophobic stratum and hydrophobic planarizing surface prevent the abrasive slurry from contacting the hydrophobic stratum at the first area.

[11] U.S. Pat. No. 5,919,082, issued Jul. 6, 1999 to Walker et al. ("[11] Walker-082"), which is incorporated by reference herein, discloses the self-limiting (self-stopping) CMP of a surface, e.g., of a semiconductor wafer, using a polishing pad having a first member with an abrasive first material, e.g., a polyurethane or polyphenyl oxide material, containing 15–1000 nm particle size abrasive particles such as $SiO_2$, $CeO_2$, $Al_2O_3$, $Ta_2O_5$ or $MnO_2$, that is structurally degraded during polishing, and a second member of a second material, e.g., an acrylate polymer such as polyacrylates and polymethyl methacrylates, that is less degradable and less abrasive than the first material but more soluble in a solvent such as $HCl/H_2O$ solutions, or such as acetone or isopropyl alcohol, than the first material. Once the desired amount of abrasive is worn from the first member, the second member contacts the wafer and reduces or stops further abrasion of the wafer.

[12] U.S. Pat. No. 5,897,426, issued Apr. 27, 1999 to Somekh ("[12] Somekh-426"), which is incorporated by reference herein, discloses CMP of a substrate, e.g., a semiconductor wafer, with a fixed abrasive polishing pad in the presence of a first polishing liquid, and then with a non-fixed abrasive polishing pad in the presence of a second polishing liquid containing abrasive particles to remove scratch defects created by the fixed abrasive polishing pad, the two polishing liquids being of different pH from each other. The non-fixed abrasive polishing pad is formed of a first layer of polyurethane and a second layer of compressed felt fibers, or is formed of a layer of porometric material.

The fixed abrasive polishing pad is formed of an upper layer of abrasive grains, e.g., fused aluminum oxide, ceramic aluminum oxide, green silicon carbide, silicon carbide, chromia, alumina zirconia, diamond, iron oxide, ceria, cubic boron nitride and/or garnet, held in a binder material on a lower layer (backing) of polymeric film, paper, cloth or metallic film. The binder material is formed from an organic polymerizable resin precursor which is cured to form the binder material, the resins including phenolic resins, urea-formaldehyde resins, melamine formaldehyde resins, acrylated urethanes, acrylated epoxies, ethylenically unsaturated compounds, amino plast derivatives having at least one pendant acrylate group, isocyanurate derivatives having at least one pendant acrylated group, vinyl ethers and/or epoxy resins (col. 4, line 63, to col. 5, line 5).

Like said [3] Cheng-670, [12] Somekh-426 also notes that fixed abrasive polishing pads are described in [4] U.S. Pat. No. 5,152,917, issued Oct. 6, 1992 to Pieper et al. (" [4] Pieper-917"); [5] U.S. Pat. No. 5,342,419, issued Aug. 30, 1994 to Hibbard ("[5] Hibbard-419"); [6] U.S. Pat. No. 5,368,619, issued Nov. 29, 1994 to Culler ("[6] Culler-619"); and [7] U.S. Pat. No. 5,378,251, issued Jan. 3, 1995 to Culler et al. ("[7] Culler-251"); which are discussed above.

[13] U.S. Pat. No. 5,972,792, issued Oct. 26, 1999 to Hudson ("[13] Hudson-792"), which is incorporated by reference herein, discloses CMP of a semiconductor wafer using a fixed abrasive polishing pad in the presence of an abrasive-free planarizing solution that oxidizes a surface layer, e.g., a metal layer, of the wafer without passing it into solution, i.e., forms a rough, scabrous layer of non-soluble oxides, such that the fixed abrasive polishing pad removes the oxidized surface layer. The polishing pad is formed of abrasive particles dispersed in a suspension medium and fixedly attached to the suspension medium.

[14] U.S. Pat. No. 5,782,675, issued Jul. 21, 1998 to Southwick ("[14] Southwick-675"), which is incorporated by reference herein, discloses an apparatus and method for refurbishing a fixed abrasive polishing pad used for planarizing CMP of a layer of a semiconductor wafer, by moving contact between the polishing pad and a refurbishing brush to remove polishing waste material therefrom without abrading or otherwise damaging the raised features on the fixed abrasive pad, while supplying a conditioning solution to the pad which interacts with the polishing waste material to effect its removal from the pad.

For example, when the layer being planarized is of poly silicon, a conditioning solution of ammonium hydroxide or tetramethyl ammonium hydroxide is usable for removing poly silicon waste material, and when such layer is of metal, a conditioning solution of hydrogen peroxide, potassium iodate, ferric nitrate, bromide, or other solution having a pH of less than 5 is usable.

[15] U.S. Pat. No. 5,972,124, issued Oct. 26, 1999 to Sethuraman et al. ("[15] Sethuraman-124"), which is incorporated by reference herein, discloses a method of cleaning a semiconductor wafer topography that has been polished by CMP technique with a fixed abrasive polishing pad formed of a polymer based matrix entrained with abrasive particles, by applying a cleaning solution of an acid and a peroxide or an acid oxidant to the topography so as to remove waste particles therefrom including abrasive particles such as cerium oxide, cerium dioxide, alpha alumina, gamma alumina, silicon dioxide, titanium dioxide, chromium oxide or zirconium oxide, derived (dislodged) from the fixed abrasive pad during the prior polishing.

Per [15] Sethuraman-124, it is noted that adhesion forces between dielectric surfaces (e.g., silicon dioxide) and the abrasive particles (e.g., $CeO_2$) are quite strong, such that the particles particularly adsorb on dielectric surfaces, it being believed that a high zeta potential, i.e., electric static or charge difference, exists between the particles and the dielectric, causing the particles to "stick" to the dielectric (col. 2, lines 56–61).

Per [15] Sethuraman-124, it is further noted that where the polishing liquid used for the underlying fixed abrasive polishing pad CMP of the wafer is an acidic liquid, a silicon nitride layer can act as a polish stop while polishing an oxide layer formed over the silicon nitride layer, e.g., in effecting a shallow trench isolation operation, in that a polish selectivity of oxide to nitride greater than 20:1 may be achieved by adjusting the acidic liquid pH to between about 6.0 and 7.0, it being postulated that the reaction rate between the acidic liquid and the oxide is substantially greater than that between such liquid and the nitride (col. 6, lines 7–28).

It is desirable to provide a polishing pad for CMP of a surface of a semiconductor wafer, having a polishing layer of friction erodible binder material containing both abrasive particles and an electrolyte substance such as a polyelectrolyte to enhance the CMP operation, wherein the binder material is incrementally eroded and in turn the abrasive particles and electrolyte substance are incrementally released into direct contact with the wafer surface being planarized.

SUMMARY OF THE INVENTION

The foregoing drawbacks are obviated in accordance with the present invention by providing a polishing pad for CMP of a surface of a substrate such as a semiconductor wafer, having a polishing layer of friction erodible binder material containing both abrasive particles and an electrolyte substance such as a polyelectrblyte to enhance the CMP operation, wherein the binder material is incrementally eroded and in turn the abrasive particles and polyelectrolyte are incrementally released into direct contact with the substrate surface being planarized.

According to a first aspect of the invention, a polishing pad is provided for CMP of a surface of a substrate such as a semiconductor wafer, comprising a sheeting material having a support surface coated with a polishing layer comprising friction erodible binder material containing substantially uniformly distributed therein both a plurality of abrasive particles and a water soluble ionizable polyelectrolyte.

According to a second aspect of the invention, a process is provided for producing a polishing pad for CMP of a surface of a substrate such as a semiconductor wafer.

The process comprises the steps of:
(1) coating a support surface of a sheeting material with a spreadable mixture of a curable friction erodible binder material precursor containing substantially uniformly distributed therein both a plurality of abrasive particles and a water soluble ionizable polyelectrolyte; and
(2) curing the binder material precursor to form a sheeting material having a support surface coated with a solidified polishing layer comprising friction erodible binder material containing substantially uniformly distributed therein both the plurality of abrasive particles and the water soluble ionizable polyelectrolyte.

According to a third aspect of the invention, a method is provided of CMP of a surface of a substrate such as a semiconductor wafer to remove a selective thickness portion thereof.

The method comprises the steps of:
(a) maintaining the surface of the substrate in the presence of an aqueous polishing liquid in frictional sliding contact with a polishing layer comprising friction erodible binder material containing substantially uniformly dispersed therein both a plurality of abrasive particles and a water soluble ionizable electrolyte substance such as a polyelectrolyte, such that during the polishing of the substrate surface by the polishing layer the binder material is incrementally eroded and in turn the abrasive particles and an electrolyte substance such as a polyelectrolyte are incrementally released into direct contact with the wafer surface; and
(b) continuing the maintaining of the substrate surface in the presence of the aqueous polishing liquid in frictional sliding contact with the polishing layer until the selective thickness portion of the substrate surface is substantially completely removed.

According to a preferred feature of the third aspect of the invention, a method is provided of CMP of a surface of a semiconductor wafer, which surface comprises the surface of an upper layer of a dielectric oxide, e.g., silicon dioxide ($SiO_2$), or of a metallic (metal) material, e.g., tungsten (W), copper (Cu), aluminum (Al), titanium (Ti), titanium nitride (TiN), tantalum (Ta) and/or tantalum nitride (TaN), overlying a lower layer of silicon nitride ($Si_3N_4$), to remove substantially completely the upper layer and expose substantially completely the lower layer of silicon nitride as a substantially intact layer essentially without removing any portion of the lower layer of silicon nitride.

The preferred feature method comprises the steps of:
(a) maintaining the surface of the upper layer in the presence of an aqueous polishing liquid in frictional sliding contact with a polishing layer comprising friction erodible binder material containing substantially uniformly dispersed therein both a plurality of abrasive particles and a water soluble ionizable electrolyte substance such as a polyelectrolyte, such that during the polishing of the surface of the upper layer by the polishing layer the binder material is incrementally eroded and in turn the abrasive particles an electrolyte substance such as a polyelectrolyte are incrementally released into direct contact with the surface of the upper layer; and
(b) continuing the maintaining of the surface of the upper layer in the presence of the aqueous polishing liquid in frictional sliding contact with the polishing layer until the upper layer is substantially completely removed and the lower layer of silicon nitride is thereby substantially completely exposed as a substantially intact layer essentially without removing any portion of the lower layer of silicon nitride.

The invention will be more readily understood from the following detailed description taken with the accompanying drawings and claims.

It is noted that the drawings are not to scale, some portions being shown exaggerated to make the drawings easier to understand.

DETAILED DESCRIPTION

Figure 1:
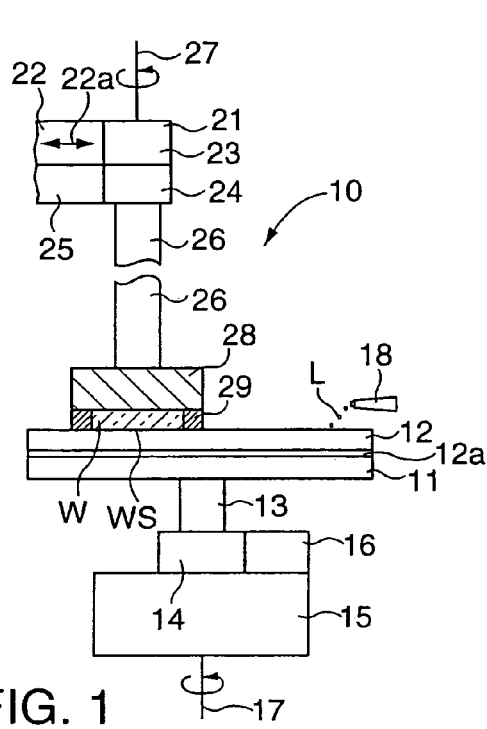
FIG. 1 is a side view, partially in section, of an apparatus for chemical mechanical polishing of a semiconductor wafer in accordance with the prior art.
Figure 2:
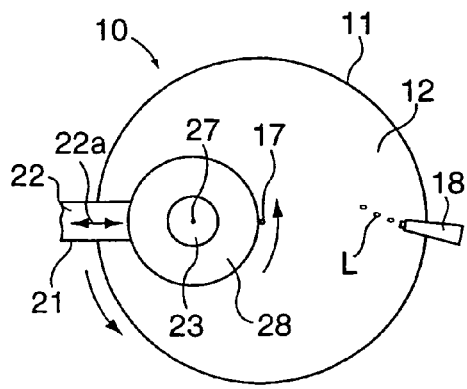
FIG. 2 is a top view of the prior art apparatus of FIG. 1.

Referring now to FIGS. 1 and 2, there is shown an apparatus 10 for CMP of a surface WS of a semiconductor wafer W in accordance with the prior art. The apparatus 10 comprises a platen 11, a polishing pad 12, a backing 12a, a shaft 13, a gear unit 14, a base 15, a motor 16, a platen axis 17 and a tube 18 for dispensing a CMP liquid (non-slurry liquid) L, and a polishing unit 21 having a support beam 22, an oscillation arrow 22a, a bearing unit 23, a gear unit 24, a motor 25, a spindle 26, a spindle axis 27, a carrier 28, and a ring 29 for retaining semiconductor wafer W having surface WS to be polished.

Platen 11 is typically formed as a circular disc, e.g., of aluminum, covered by fixed abrasive polishing pad 12, e.g., of sheeting material, having a backing 12a, e.g., formed of a polyester film, on which is disposed a conventional polishing layer of fixed abrasive particles embedded in a binder material (not shown). Platen 11 is carried on shaft 13 which is mounted via gear unit 14 on base 15 for rotation by motor 16 about a stationary platen axis 17 in conventional manner.

Tube 18 is stationarily located in overlying relation to platen 11 to dispense, e.g., dropwise, slurry-less polishing liquid L, i.e., a polishing liquid without freely suspended abrasive particles, e.g., deionized water, onto polishing pad 12 at a given flow rate. Polishing unit 21 is located generally diametrically opposite tube 18 with respect to platen axis 17.

Polishing unit 21 includes support beam 22 which is mounted on a base (not shown) for back and forth oscillation, e.g., in a radial direction relative to platen axis 17, as indicated by oscillation arrow 22a. Support beam 22 carries bearing unit 23, gear unit 24 and motor 25 for common oscillation therewith. Spindle 26 is mounted at its top end in bearing unit 23 and gear unit 24 for rotation by motor 25 about spindle axis (wafer axis) 27 and for common oscillation with support beam 22, in conventional manner. Carrier 28 is mounted at its upper portion on the bottom end of spindle 26 for common rotation and oscillation therewith. The lower portion of carrier 28 carries ring 29 for common rotation and oscillation therewith.

Ring 29 has a medial aperture adapted to retain therein for common movement with ring 29 in conventional manner semiconductor wafer W, e.g., of silicon, having a surface WS, e.g., of an upper layer of silicon dioxide ($SiO_2$) overlying a lower (inner) layer of silicon nitride ($Si_3N_4$), e.g., as a stop layer, to be chemically mechanically polished (planarized). Wafer W is maintained in ring 29 and against the underside portion of carrier 28 for common movement therewith.

Support beam 22 is arranged such that wafer W is maintained in frictional sliding contact with polishing pad 12 as it is rotated, e.g., counter-clockwise, and oscillated, e.g., in the direction of arrow 22a, and as platen 11 is rotated in like manner, e.g., also counter-clockwise, in conventional manner, while (slurry-free) polishing liquid L, e.g., containing an electrolyte substance, such as (i) an inorganic electrolyte or (ii) an organic electrolyte, or (iii) a polyelectrolyte, is dispensed from tube 18 onto pad 12.

It is clear from FIGS. 1 and 2 that the conventional CMP process has the problem of different parts of wafer W encountering droplets of liquid L with different chemical constitution and in different amounts, depending on the constantly varying distance between the rotating and oscillating wafer W, and in particular its leading and trailing oscillating edges at its periphery, and the centrifugally outwardly travelling droplets of liquid L dispensed onto the rotating platen 11 from the stationary tube 18. Hence, the polishing liquid chemical constitution and its available amount at the constantly changing local polishing site of wafer W are non-uniform and so also is the CMP operation.

Inherently, some liquid L on pad 12 is pushed off platen 11 by wafer W since its surface WS frictionally contacts polishing pad 12, typically under mechanical pressure (down force). This loss of polishing liquid L increases operating costs. Because of its constant frictional sliding contact with polishing pad 12, wafer W also impedes flow of liquid L to the central area of its surface WS, causing poor center-to-edge uniformity.

These drawbacks of conventional CMP cause adverse variation in the local removal rate of material from different parts of wafer W due to variation in the amount and chemical constitution of liquid L contacting wafer surface WS, thus diminishing the degree of within-wafer uniformity, while the wastage of liquid L increases operating costs.

Such drawbacks are avoided according to the invention.

Figure 3A:
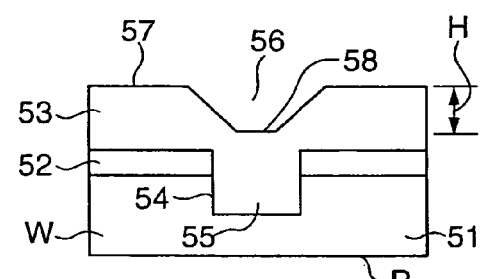
FIGS. 3A, 3B and 3C are a series of side views of a semiconductor wafer subjected to CMP on the apparatus of FIGS. 1–2 using a polishing pad in accordance with the invention.
Figure 3B:
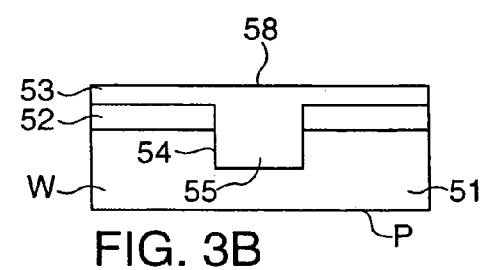
Figure 3C:
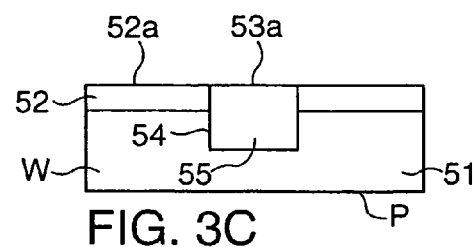

Referring now to FIGS. 3A, 3B and 3C, a series of side views is shown of semiconductor wafer W, e.g., having a shallow trench isolation (STI) arrangement, subjected to CMP on the apparatus of FIGS. 1 and 2 using a polishing pad in accordance with the invention. Wafer W has a base 51, a lower layer 52, a polished top surface 52a, an upper layer 53, a polished top surface 53a, a trench 54, an isolation portion 55, a depression 56, a top surface 57, a depression surface 58, a plane P, and a height H.

For example, base 51, e.g., of silicon, is provided with a lower (inner) layer 52, e.g., of silicon nitride, such as in the form of a stop layer, deposited thereon, e.g., by plasma enhanced chemical vapor deposition (PECVD) in conventional manner. Per photo lithographic patterning and etching technique, trench 54 is next formed so as to extend downwardly through silicon nitride lower layer 52 and into the upper portion of base 51. Then, upper layer 53, e.g., of silicon dioxide, is deposited, e.g., also by PECVD, on silicon nitride lower layer 52 so as to fill trench 54 and form isolation portion 55 therein while also overfilling the site at the lateral portions of silicon nitride lower layer 52, such that depression 56 is defined between top surface 57 of silicon dioxide upper layer 53 and depression surface 58 overlying isolation portion 55.

Figure 4:
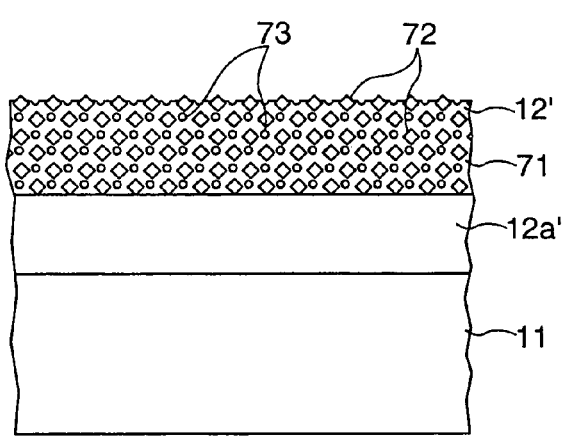
FIG. 4 is a schematic side view representation, partially in section, of a polyelectrolyte dispensing polishing pad usable for CMP of a semiconductor wafer in accordance with the invention.

Wafer W, as shown in FIG. 3A, is then subjected to CMP, using the polishing pad of FIG. 4 according to the invention, to remove the excess portion of silicon dioxide upper layer 53, represented by the height H differential between depression surface 58 and top surface 57, i.e., parallel to reference plane P, in an initial stage, as shown in FIG. 3B.

After so removing the main portion of the thickness of silicon dioxide upper layer 53, the remaining overfill portion of silicon dioxide upper layer 53 is completely removed in a final stage, as shown in FIG. 3C. The final stage removal of silicon dioxide upper layer 53 is desirably effected so as to avoid removal of any portion of silicon nitride lower layer 52 therebelow, such that isolation portion 55 has its top surface 53a substantially flush with the laterally adjacent top surface 52a of the portion of silicon nitride lower layer 52 bordering isolation portion 55 of silicon dioxide upper layer 53.

Referring now to FIG. 4, a schematic side view representation is shown, partially in section, of a polyelectrolyte dispensing polishing pad usable for CMP of a semiconductor wafer or other substrate as a work piece, as depicted in FIGS. 3A, 3B and 3C, according to the invention.

Schematically shown in FIG. 4 is the polishing pad 12' of the invention, having backing 12a', which corresponds to polishing pad 12 and its backing 12a per the prior art, and which is mounted on platen 11 in the same way as polishing pad 12. Polishing pad 12', e.g., of sheeting material having a support surface (backing 12a'), not only contains friction erodible binder material 71 and fixed abrasive particles 72 (for convenience, symbolically represented by squares) as in the conventional polishing pad 12, but more important, further contains therewith water soluble ionizable polyelectrolyte 73 (for convenience, symbolically represented by circles).

As symbolically represented in FIG. 4, both abrasive particles 72 and polyelectrolyte 73 are substantially uniformly (homogeneously) distributed in binder material 71, such that as binder material 71 incrementally erodes (abrades) during the CMP operation, both the abrasive particles 72 and water soluble ionizable polyelectrolyte 73 incrementally release into direct contact with the surface WS of wafer W being polished.

Thus, during relative periodic movement of wafer W with respect to platen 11, as shown in FIGS. 1 and 2, per the present invention (slurry-free and electrolyte substance-free) aqueous polishing liquid L is dispensed at a predetermined flow rate uniformly onto polishing pad 12' for immediate local and uniform contact with water soluble ionizable polyelectrolyte 73 as liquid L reaches each given local point on polishing pad 12'. Polyelectrolyte 73 is thereby uniformly dispensed at every point of relative travel of wafer W across the surface of polishing pad 12' and during such travel immediately dissolves in the extant portion of aqueous liquid L thereat.

Aqueous polishing liquid L is typically dispensed as a dropwise flow directed onto polishing pad 12' in the vicinity of wafer surface WS of wafer W, e.g., at a flow rate of about 10–1,000, preferably about 100–200, e.g., about 150, mL/min. Platen 11 is rotated at about 10–100, preferably about 25–50, e.g., about 40, rpm and ring 29 and wafer W are commonly rotated at about 10–100, preferably about 25–50, e.g., about 40, rpm and within a differential of about 5 rpm of the speed of rotation of platen 11. At the same time, ring 29 and wafer W are also oscillated such as at a frequency of about 3–8, e.g., about 5, cpm, and at an amplitude of about 10–30, e.g., about 20, mm. The polishing time of the CMP operation is generally about 1–5, e.g., 2, minutes in duration.

Wafer W is typically of circular disc shape with a diameter of about 8 inches (200 mm) or 12 inches (300 mm), and formed of silicon. Platen 11 typically has a diameter of about 20 inches and a circumference of about 62.8 inches.

Per the invention, the aqueous polishing liquid is typically dispensed at a temperature of about 15–50° C. and the wafer surface being polished is maintained in frictional contact with the polishing pad under a positive mechanical pressure (down force), e.g., of about 1–10 psi, such as about 5 psi.

The aqueous polishing liquid may be any suitable CMP liquid such as deionized water, e.g., at substantially neutral pH, i.e., about pH 7, and optionally desirably containing a polishing enhancing reactive agent such as a basic aqueous liquid, e.g., an aqueous potassium hydroxide (KOH) or ammonium hydroxide. ($NH_4OH$) solution of about pH 7.5–13, especially about pH 8–12, e.g., where the surface being polished is a dielectric oxide such as silicon dioxide, or an acidic aqueous liquid, e.g., an aqueous sulfuric acid ($H_2SO_4$) or hydrofluoric acid (HF) solution of about pH 2–6.5, especially about pH 3–6, e.g., where the surface being polished is a metal (e.g., W, Cu, Al, Ti, TiN, Ta and/or TaN), or the like, or instead where the surface being polished is a dielectric oxide such as silicon dioxide.

For example, the aqueous polishing liquid can be a 5% KOH aqueous solution (in 95% deionized water) for silicon dioxide CMP, i.e., for promoting hydroxylation of the silicon dioxide surface, such that a surface layer, i.e., film, of silicon hydroxides is formed from the reaction of the hydroxide, e.g., potassium hydroxide, with the silicon dioxide surface, which film is progressively removed during the polishing. The hydroxylation of the silicon dioxide promoted by the presence of the basic polishing liquid enhances the removal rate of the oxide film.

According to an exemplary production process embodiment of the invention:

100 parts by weight of ceria particles having an average particle size of 200 nm;

100 parts by weight of 2-hydroxy ethyl acrylate (HEA) as curable binder material (resin) precursor; and 100 parts by weight of poly(acrylic acid) in solid particle form as water soluble ionizable polyelectrolyte;

are thoroughly mixed in conventional manner to provide a spreadable slurry in which the abrasive particles and polyelectrolyte are homogeneously distributed.

The slurry is applied as a layer onto a polyethylene film backing, and cured in conventional manner by heating at about 50° C. for about 4 hours and sufficiently to form on the backing a solidified polishing layer containing uniformly distributed in the cured binder resin both the abrasive particles and the water soluble ionizable polyelectrolyte.

Alternatively, the polyelectrolyte in the above exemplary production example is present in the liquid solution form such as a 10% by weight aqueous solution of the poly (acrylic acid) in water.

Generally, in the liquid form, the polyelectrolyte can be present at a concentration of about 0.1–30% by weight in water (e.g., 0.1–30 grams of polyelectrolyte per 99.9–70 grams of water) in the formulation mixture with the abrasive particles and binder material.

It is noted that the release rate of the abrasive particles and water soluble ionizable electrolyte substance such as polyelectrolyte from the polishing pad is dependent on the degree of cross linking of the erodible binder material, the applied down force of the work piece against the polishing pad, the pH of the aqueous polishing liquid, and the aggressive topography of the work piece being polished for achieving abrading action to erode incrementally the binder material and in turn release incremental portions of the abrasive particles and electrolyte substance such as polyelectrolyte.

Indeed, release of the abrasive particles and electrolyte substance such as polyelectrolyte occurs in a controlled manner during the frictional sliding contact between the polishing pad and work piece and in fact only occurs during actual polishing of the work piece and in a controlled amount, so that there is no wastage thereof.

Clearly, the immediate release of the electrolyte substance such as polyelectrolyte into direct contact with the work piece as it travels across a given site of the polishing pad in the presence of the aqueous polishing liquid greatly enhances the polishing rate selectivity toward dielectric oxide or metal and away from silicon nitride.

Specifically, the polishing rate selectivity is not in favor of silicon nitride, but instead in the presence of an electrolyte substance such as a polyelectrolyte, plus an aqueous polishing liquid, polishing of silicon nitride is inhibited (suppressed), being rendered essentially non-existent (i.e., insignificantly low polishing rate removal of silicon nitride).

On the other hand, in the presence of an electrolyte substance such as a polyelectrolyte, plus an aqueous polishing liquid, polishing is preferential toward or selective for polishing of dielectric oxide such as silicon dioxide (whether optionally using a basic aqueous polishing liquid or not), or for polishing of a metallic (metal) layer such as of W, Cu, Al, Ti, TiN, Ta, TaN or the like (whether optionally using an acidic aqueous polishing liquid or not), with respect to each of which the CMP polishing is promoted (selective), being enhanced by the presence of the electrolyte substance (i.e., significantly high polishing rate removal of dielectric oxide or of metal, compared to silicon nitride, e.g., in deionized water as aqueous polishing liquid, i.e., whether or not a reactive agent such as a base or an acid is also present in the aqueous polishing liquid).

The polyelectrolytes usable as electrolyte substance according to the invention are polymers producing large chain type ions in solution, that can carry positive or negative groups along the polymer chain. They contain at least one ionizable group such as acidic groups, basic groups, and both acidic groups and basic groups, and comprise a solid polymer, e.g., in dry particle, e.g., powder, form, such as one having a weight average molecular weight of about 100–1,000,000, preferably about 500–20,000, more preferably about 500–11,000, and especially about 200–500, such as poly(acrylic acid), poly(methacrylic acid), poly (methyl methacrylic acid), poly(maleic acid), poly(vinyl sulfonic acid), poly(acrylic acid-co-maleic acid), poly(vinyl amine), poly(ethylenimine), poly(4-vinyl pyridine), poly (amino acid), salts thereof, and esters thereof.

The polyelectrolytes contemplated herein include those disclosed in said [1] U.S. Pat. No. 5,876,490 ([1] Ronay-490). These are substances that contain poly ions, which are macro-molecules having a large number of ionic groups, and to preserve their electro-neutrality, the poly ion charges must be compensated by counter ions, typically ions of low molecular weight such as $H^+$ or $Na^+$. They are generally soluble in polar solvents, e.g., water, and can be classified as polyacids, as polybases, or as polyampholytes if both acidic and basic groups are present (col. 4, line 65, to col. 5, line 8).

The ionizable groups include acidic groups such as carboxyl groups, e.g., in poly(acrylic acid), poly(methacrylic acid), poly(methyl methacrylic acid), poly(maleic acid), or saturated or unsaturated poly(carboxylic acids); and basic groups including nitrogen containing groups, such as polymers with amino, amide, imide, vinyl pyridine, piperidine and piperazine derivatives, e.g., poly(ethylenimine) (col. 5, lines 26–36).

Particular ionizable chain molecules contemplated (col. 5, line 52, to col. 6, line 31) include (e.g., where the monomer unit n=5–200):

1. poly (acrylic acid)      [—$CH_2$—CH(COOH)—]$_n$
2. poly (methacrylic acid)      [—$CH_2$—C($CH_3$)(COOH)—]$_n$
3. poly (vinyl sulfonic acid)      [—$CH_2$—CH($SO_3$H)—]$_n$
4. poly (acrylic acid-co-maleic acid)      [—$CH_2$—CH(COOH)—CH(COOH)—CH(COOH)—]$_n$
5. poly (vinyl amine)      [—$CH_2$—CH($NH_2$)—]$_n$
6. poly (ethylenimine)      [—$CH_2$—$CH_2$—NH—]$_n$
7. poly (4-vinyl pyridine)      [—$CH_2$—CH(4-$C_5H_4$N)—]$_n$ The polyelectrolytes contemplated herein also include those disclosed in said [2] U.S. Pat. No. 5,968,280 ([2] Ronay-280). Besides those disclosed in said [1] Ronay-490, as noted above, they include salts and esters of the previously discussed compounds, such as the following compounds, wherein the repeat number n of the monomer unit is preferably 5–200, and Y is $OC_1$-$C_4$ alkyl (i.e., alkoxy of 1–4 C-atoms), $OH^-$ or alkali metal ion such as said $Na^+$, $K^+$ and $NH_4^+$ ion.

8. salts or esters of poly-(acrylic acid)

[—$CH_2$—CH(COY)—]$_n$ 9. salts or esters of poly(methacrylic acid)

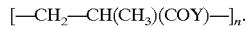
[—$CH_2$—C($CH_3$)(COY)—]$_n$.

The abrasive particles usable herein include conventional particles, especially ceria, silica, alumina, zirconia, titania, and rare earth oxides other than ceria. Rare earth oxides are generally regarded as the oxides of the lanthanides (atomic numbers 57 to 71), i.e., lanthanum (La=57), cerium (Ce=58), praseodymium (Pr=59), neodymium (Nd=60), promethium (Pm=61), samarium (Sm=62), europium (Eu=63), gadolinium (Gd=64), terbium (Tb=65), dysprosium (Dy=66), holmium (Ho=67), erbium (Er=68), thulium (Tm=69), ytterbium (Yb=70) and lutetium (Lu=71).

However, as contemplated herein the rare earth oxides also include the oxides of scandium (Sc=21), yttrium (Y=39), zirconium (Zr=40), i.e., zirconia as noted above, hafnium (Hf=72), and thorium (Th=90). Thus, besides ceria, silica, alumina, zirconia and titania, i.e., the oxides of Ce, Si, Al, Zr and/or Ti, the abrasive particles can also be the oxides of Sc, Y, La, Pr, Nd, Pm, Sm, Eu, Gd, Tb, Dy, Ho, Er, Tm, Yb, Lu, Hf and/or Th.

The abrasive particles desirably have an average particle size of about 1–20,000 nm (0.001–20 microns), preferably 10–1,000 nm.

The binder material contemplated herein includes the conventional organic polymers (curable, cross linkable polymer precursors formed into cured, cross linked polymers) used as binder resins (polymer resins) for fixed-abrasive polishing pads, especially amino resins, acrylate resins, alkyd resins, polyester resins, urethane resins, phenolic resins, epoxy resins, isocyanate resins, isocyanurate resins, polysiloxane resins, polyimide resins, vinyl resins, urea-formaldehyde resins, melamine-formaldehyde resins, styrene resins, vinyl toluene resins, divinyl benzene resins, and mixtures thereof.

The binder resins include those enumerated in said [4] U.S. Pat. No. 5,152,917 ([4] Pieper-917) (especially col. 5, line 3, to col. 6, line 4), such as phenolic resins, amino plast resins, urethane resins, epoxy resins, acrylate resins, acrylated isocyanurate resins, urea-formaldehyde resins, isocyanurate resins, acrylated urethane resins, acrylated epoxy resins, glues, and mixtures thereof, or thermoplastic resins (col. 5, lines 11–17), with resin curing (cross linking) being effected by an energy source such as heat, infra red irradiation, electron beam, ultra violet radiation, or visible radiation (col. 5, lines 19–21).

The binder resins include those enumerated in said [5] U.S. Pat. No. 5,342,419 ([5] Hibbard-419) (especially col. 4, line 60, to col. 5, line 8; and col. 10, line 56, to col. 12, line 20), such as addition polymerizable resins including ethylenically unsaturated resins and epoxy resins, and preferably acrylated urethane resins, acrylated epoxy resins, ethylenically unsaturated monomers (such as styrene, vinyl toluene, divinyl benzene, and the like), amino plast resins having pendant unsaturated carboxyl groups, isocyanurate resins having at least one pendant acrylate group, isocyanate resins having at least one pendant acrylate group, and the like, and especially as an ethylenically unsaturated material the triacrylate of tris (hydroxy ethyl)isocyanate combined with trimethyl propane triacrylate (col. 4, line 60, to col. 5, line 8).

The binder resins include those enumerated in said [6] U.S. Pat. No. 5,368,619 ([6] Culler-619) (especially col. 8, lines 14–28; and col. 8, line 56, to col. 9, line 56), such as addition polymerizable resins including styrene, divinyl benzene, vinyl toluene, and amino plast resins having pendant unsaturated carboxyl groups, isocyanurate resins having at least one pendant acrylate group, acrylated urethane resins, acrylated epoxy resins, and isocyanate derivatives having at least one pendant acrylate group, especially where the isocyanurate resin having at least one pendant acrylate group is the triacrylate of tris (hydroxy ethyl)isocyanurate dissolved in trimethylol propane triacrylate (col. 8, line 14–28).

The binder resins include those enumerated in said [7] U.S. Pat. No. 5,378,251 ([7] Culler-251) (especially col. 5, line 50, to col. 7, line 22), such as condensation curable and addition polymerizable resins, and preferably organic resins including phenolic resins, urea-formaldehyde resins, melamine-formaldehyde resins, acrylated urethanes, acrylated epoxies, ethylenically unsaturated compounds, amino plast derivatives having pendant unsaturated carboxyl groups, isocyanurate derivatives having at least one pendant acrylate group, isocyanate derivatives having at least one pendant acrylate group, vinyl ethers, epoxy resins, and mixtures thereof (col. 5, line 61, to col. 6, line 1).

The binder resins include those enumerated in said [8] U.S. Pat. No. 5,958,794 ([8] Bruxvoort-794) (especially col. 22, line 64, to col. 26, line 42; and col. 27, lines 20–44), such as amino resins (e.g., amino plast resins) including alkylated urea-formaldehyde resins, melamine-formaldehyde resins, and alkylated benzoguanamine-formaldehyde resins, plus acrylate resins (including acrylates and methacrylates) such as vinyl acrylates, acrylated epoxies, acrylated urethanes, acrylated polyesters, acrylated acrylics, acrylated polyethers, vinyl ethers, acrylated oils, and acrylated silicones, alkyd resins such as urethane alkyd resins, polyester resins, reactive urethane resins, phenolic resins such as resole and novolac resins, phenolic/latex resins, epoxy resins such as bisphenol epoxy resins, isocyanates, polysiloxane resins (including alkyl alkoxy silane resins), reactive vinyl resins, and the like (col. 23, lines 25–38).

The binder resins include those enumerated in said [12] U.S. Pat. No. 5,897,426 ([12] Somekh-426) (especially col. 4, line 63, to col. 5, line 5), such as phenolic resins, urea-formaldehyde resins, melamine-formaldehyde resins, acrylated urethanes, acrylated epoxies, ethylenically unsaturated compounds, amino plast derivatives having at least one pendant acrylate group, isocyanurate derivatives having at least one pendant acrylate group, vinyl ethers, epoxy resins, and combinations thereof (col. 4, line 63, to col. 5, line 5).

The abrasive particles and associated water soluble ionizable polyelectrolyte can be provided in the binder material in the form of abrasive articles such as three dimensional, textured, fixed abrasive articles comprising a plurality of abrasive composites of predetermined precise or irregular shape on a backing, e.g., produced by curing the binder-resin precursor in a slurry containing the binder resin precursor and abrasive particles and polyelectrolyte while the slurry is being applied onto the backing and its exposed surface is being filled into corresponding reverse image preshaped cavities (molds) on the surface of a production tool and at least partially cured before removal from the tool.

The backing of the polishing pad may be of any desired conventional material such as a polymeric film, paper, cloth, metallic film, vulcanized fiber or nonwoven substrate, such as a polyester film.

The formation of such preshaped abrasive articles containing a plurality of abrasive composites is generally disclosed in said [8] Bruxvoort-794 (col. 34, lines 6–31); said [4] Pieper-917 (col. 8, lines 49–61; and col. 9, lines 20–25); said [5] Hibbard-419 (col. 17, lines 28–61); said [6] Culler-619 (col. 16, line 49, to col. 17, line 8); and [7] Culler-251 (col. 12, line 45, to col. 13, line 19). Per the present invention, however, the procedure is modified to include in the conventional formulation mixture (slurry) the instant water soluble ionizable electrolyte substance such as a polyelectrolyte.

Whether the binder material containing both the abrasive particles and water soluble ionizable electrolyte substance such as a polyelectrolyte is formed into a polishing layer of complex preshaped abrasive articles containing abrasive composites on the backing of the polishing pad, or is formed into a simple polishing layer of uniformly mixed and distributed (non-preshaped) contents and components on the backing of the polishing pad, the resulting binder material (cured resin) layer constitutes a friction erodible binder material containing substantially uniformly distributed therein both the abrasive particles and the electrolyte substance such as a polyelectrolyte. Hence, during CMP of the wafer by the polishing pad, the binder material is incrementally eroded and in turn the abrasive particles and electrolyte substance such as polyelectrolyte are incrementally released into direct contact with the wafer surface.

While the matter is not completely understood at this time, it is believed that upon mixing the polyelectrolyte, which is provided as a polymer in the form of solid particles or in, e.g., aqueous, liquid solution form, and the abrasive particles with the binder material, i.e., curable binder resin precursor, the resulting slurry constitutes an organic liquid based binder resin precursor mixture in which the water soluble ionizable polyelectrolyte is disposed. However, during the mixing, the polyelectrolyte is homogeneously distributed conjointly with the abrasive particles throughout the bulk volume of the slurry. In addition, the polyelectrolyte adsorbs at least to some extent on the surface of the abrasive particles.

Hence, when the slurry mass is cured to form a polishing layer on the polishing pad, the abrasive particles and polyelectrolyte are homogeneously distributed throughout the bulk of the cured binder material and the polyelectrolyte is also uniformly distributed to at least some extent on the surface of the abrasive particles.

Since the polyelectrolyte is highly soluble in deionized water, upon release from the polishing layer of the polishing pad and contact with the aqueous polishing liquid disposed on the polishing pad, the polyelectrolyte according to the invention behaves similarly in use to that of an aqueous polishing liquid containing a polyelectrolyte therein, e.g., at a polyelectrolyte concentration of about 0.01–500 g/L and a pH of about 1–12, and dispensed onto the polishing pad according to the prior art.

However, according to the invention, the polyelectrolyte is always immediately and freshly released into direct contact with the wafer or other substrate work piece surface being polished for immediate dissolution into the local portion of the aqueous polishing liquid thereat.

Desirably, on a weight basis, the abrasive particles are present in an amount of about 50 to 500 parts per 100 parts of the binder material, and the electrolyte substance such as a polyelectrolyte is present in an amount of about 50 to 200 parts by weight per 100 parts of the abrasive particles.

The present invention thus provides a system for minimizing variation in the local removal rates of material from different parts of the semiconductor wafer caused by variation in the amount and concentration of the electrolyte substance such as a polyelectrolyte actually coming into contact with the wafer surface being polished. This improves the within-wafer uniformity. The incremental dispensing of the polyelectrolyte directly from the polishing pad and directly into contact with the wafer surface being polished and only during sliding contact movement of the wafer against the polishing pad, instead of from a remote stationary tube, inherently reduces consumption of the polyelectrolyte and aqueous polishing liquid to a minimum.

By releasing the polyelectrolyte incrementally from the polishing pad only during sliding frictional contact thereof with the wafer, it is dispensed and simultaneously introduced in immediate adjacency to the wafer during its rotation and oscillation. The polyelectrolyte is supplied from the polishing pad very close to the wafer, irrespective of the relative rotational and/or oscillational movement position of wafer and polishing pad.

This dispensing of the polyelectrolyte at the immediate site of use for CMP of the wafer minimizes any change in the polyelectrolyte concentration from its original concentration as it contacts and dissolves into the aqueous polishing liquid located on the polishing pad thereat. The thus polyelectrolyte containing aqueous polishing liquid is accordingly able to reach the central portion of wafer surface being polished whereby to provide a concordantly improved degree of uniformity and rate of removal, while minimizing polyelectrolyte and aqueous polishing liquid usage and wastage. Due to the direct manner of feeding the polyelectrolyte to the wafer surface being polished, the aqueous polishing liquid desirably maintains a uniform pH.

It is clear that the system of the present invention is applicable to all CMP processes, with suitable attendant optimization depending on the pertinent polyelectrolyte amount and concentration, and aqueous polishing liquid flow rate desired. In all cases, the CMP method can be carried out using the fixed abrasive and polyelectrolyte containing polishing pad of the invention so as to maintain the conjoint incremental dispensing of the abrasive particles and polyelectrolyte at a uniform rate, and at an associated aqueous polishing liquid flow rate, for achieving a uniform polyelectrolyte amount and concentration and a uniform aqueous polishing liquid pH, and thus achieve uniform CMP of the wafer surface being polished in a reproducible manner as desired in accordance with the invention.

Ultimately, according to an overall CMP method embodiment, the invention contemplates use during the CMP of a polishing pad with a polishing layer having a friction erodible binder material containing uniformly dispersed therein both a plurality of abrasive particles and a water soluble ionizable electrolyte substance in a chemical mechanical polishing effective amount for achieving such CMP of the wafer surface being polished and comprising (i) an inorganic electrolyte, e.g., a water soluble ionizable inorganic salt of an acid and a base; (ii) an organic electrolyte, e.g., water soluble ionizable amino acids, amines, amides, pyridinium halides (e.g., chlorides), ethylene glycols, ethylene oxides, and mixtures thereof; and/or (iii) a polyelectrolyte as aforesaid.

This polishing pad is advantageously usable for CMP of a surface of a semiconductor wafer, which surface comprises the surface of an upper layer of dielectric oxide, e.g., silicon dioxide, or of a metal, i.e., metallic layer, e.g., W, Cu, Al, Ti, TiN, Ta, and/or TaN, overlying a lower layer of silicon nitride, e.g., serving as a stop layer, to remove the upper layer and expose the lower layer of silicon nitride as a substantially intact layer essentially without removing any portion of the lower layer of silicon nitride.

This overall CMP method comprises the steps of:
(a) maintaining the surface of the upper layer of dielectric oxide or of metal in the presence of the aqueous polishing liquid in frictional sliding contact with said polishing layer, such that during the polishing of the surface of the upper layer by the polishing layer, the binder material is incrementally eroded and in turn the abrasive particles and electrolyte substance are incrementally released into direct contact with the surface of the upper layer; and
(b) continuing the maintaining of the surface of the upper layer in the presence of the aqueous polishing liquid in frictional sliding contact with the polishing layer until the upper layer is substantially completely removed and the lower layer of silicon nitride is thereby substantially completely exposed as a substantially intact layer essentially without removing any portion of the lower layer of silicon nitride.

Significantly, the electrolyte substance is released in the presence of the aqueous polishing liquid sufficiently for coating the lower layer of silicon nitride therewith as the lower layer of silicon nitride becomes exposed during the polishing for thereby inhibiting removal of the lower layer of silicon nitride thereat. This is because the electrolyte substance, i.e., (i) an inorganic electrolyte, (ii) an organic electrolyte, and/or (iii) a polyelectrolyte, is preferential for selective CMP of dielectric oxide layers and metallic (metal) layers and inhibits (suppresses) CMP of silicon nitride layers, whether the associated aqueous polishing liquid contains a reactive agent such as a base or acid therein or not.

In the same way as the previous embodiments, by weight, the abrasive particles are present in an amount of about 50–500 parts per 100 parts of the binder material, and the electrolyte substance, i.e., (i) inorganic electrolyte, (ii) organic electrolyte and/or (iii) polyelectrolyte, is present in an amount of about 50–200 parts per 100 parts of the abrasive particles, i.e., in a chemical mechanical effective amount for achieving the CMP of the desired surface of the semiconductor wafer.

Typically, the aqueous polishing liquid is deionized water, and optionally contains a polishing enhancing reactive agent such as a base, e.g., where the upper layer is a dielectric oxide layer, or an acid, e.g., where the upper layer is a metallic (metal) layer, or instead where the upper layer is a dielectric oxide layer, e.g., of silicon dioxide. However, selective CMP removal of the upper layer and suppression of CMP removal of the lower layer of silicon nitride results even where the aqueous polishing liquid is deionized water alone.

As earlier noted, as distinguished from polyelectrolytes, electrolytes are substances that dissociate into ions in water, including
(i) inorganic electrolytes, i.e., water soluble ionizable salts of inorganic acids and bases such as water soluble alkali metal (e.g., sodium, potassium, lithium and cesium), alkaline earth metal (e.g., calcium, magnesium, strontium and barium), and ammonium, salts, including water soluble halides (i.e., chlorides, bromides, iodides and fluorides), nitrates, sulfates (i.e., excluding water insoluble sulfates such as calcium sulfate, barium sulfate and strontium sulfate), and the like, thereof; and
(ii) organic electrolytes, i.e., water soluble ionizable organic compounds such as amino acids, amines, amides, pyridinium halides (e.g., chloride), ethylene glycols, ethylene oxides, and the like.

Although conventional fixed abrasive particle polishing pads have been proposed which have a polishing layer of a binder material containing abrasive particles together with additives such as water soluble ionizable salts of inorganic acids and bases, and water soluble ionizable organic compounds such as amines, amides, and glycols, these additives were not included in the polishing layer formulation for inhibiting CMP removal of an underlying layer of silicon nitride, e.g., as a stop layer, and at the same time selectively achieving preferential CMP removal of an overlying layer of dielectric oxide, e.g., of silicon dioxide, or of a metal (metallic layer), in the manner of the present invention as described above.

Hence, such conventional proposals do not enrich the art in the instant field of endeavor. On the other hand, the present invention provides an overall CMP method enabling use of a fixed abrasive particle polishing pad having a polishing layer of a binder material containing abrasive particles together with an electrolyte substance such as (i) a water soluble ionizable salt of an inorganic acid and an inorganic base, (ii) a water soluble ionizable organic compound such as an amino acid, amine, amide, pyridinium halide, ethylene glycol, and/or ethylene oxide, and/or (iii) a polyelectrolyte, as aforesaid, not as a binder material formulation additive, but rather to inhibit CMP removal of an underlying layer of silicon nitride, e.g., as a stop layer, and at the same time selectively achieve preferential CMP removal of an overlying layer of dielectric oxide, e.g., of silicon dioxide, or of a metal (metallic layer), as described above.

Accordingly, it can be appreciated that the specific embodiments described are merely illustrative of the general principles of the invention. Various modifications may be provided consistent with the principles set forth.

What is claimed is:

1. A polishing pad for chemical mechanical polishing of a surface of a substrate, comprising a sheeting material having a support surface coated with a polishing layer comprising friction erodible binder material containing substantially uniformly distributed therein both a plurality of abrasive particles and a water soluble ionizable polyelectrolyte.

2. The pad of claim 1 wherein the polyelectrolyte contains an ionizable group selected from the group consisting of acidic groups, basic groups, and both acidic groups and basic groups.

3. The pad of claim 1 wherein the polyelectrolyte comprises a polymer in the form of solid particles.

4. The pad of claim 1 wherein the polyelectrolyte comprises a polymer in liquid solution form.

5. The pad of claim 1 wherein the polyelectrolyte has a molecular weight of about 100–1,000,000.

6. The pad of claim 1 wherein the polyelectrolyte is selected from the group consisting of poly (acrylic acid), poly (methacrylic acid), poly (methyl methacrylic acid), poly (maleic acid), poly (vinyl sulfonic acid), poly (acrylic acid-co-maleic acid), poly (vinyl amine), poly (ethylenimine), poly (4-vinyl pyridine), poly (amino acid), salts thereof, and esters thereof.

7. The pad of claim 1 wherein the abrasive particles comprise at least one member selected from the group consisting of ceria, silica, alumina, zirconia, titania, and rare earth oxides other than ceria.

8. The pad of claim 1 wherein the abrasive particles have an average particle size of about 1–20,000 nm.

9. The pad of claim 1 wherein the binder material comprises a polymer resin.

10. The pad of claim 1 wherein the binder material comprises a polymer resin selected from the group consisting of amino resins, acrylate resins, alkyd resins, polyester resins, urethane resins, phenolic resins, epoxy resins, isocyanate resins, isocyanurate resins, polysiloxane resins, polyimide resins, vinyl resins, urea-formaldehyde resins, melaniine-formaldehyde resins, styrene resins, vinyl toluene resins, divinyl benzene resins, and mixtures thereof.

11. The pad of claim 1 wherein, by weight, the abrasive particles are present in an amount of about 50–500 parts per 100 parts of the binder material, and the polyelectrolyte is present in an amount of about 50–200 parts per 100 parts of the abrasive particles.

12. A polishing pad for chemical mechanical polishing of a surface of a semiconductor wafer, comprising a sheeting material having a support surface coated with a polishing layer comprising friction erodible polymer resin containing substantially uniformly distributed therein both a plurality of abrasive particles and a water soluble ionizable polyelectrolyte;

wherein the polyelectrolyte contains an ionizable group selected from the group consisting of acidic groups, basic groups, and both acidic groups and basic groups; and wherein, by weight, the abrasive particles are present in an amount of about 50–500 parts per 100 parts of the binder material, and the polyelectrolyte is present in an amount of about 50–200 parts per 100 parts of the abrasive particles.

13. The pad of claim 12 wherein the polyelectrolyte comprises a polymer in the form of solid particles.

14. The pad of claim 12 wherein the polyelectrolyte comprises a polymer in liquid solution form.

15. The pad of claim 12 wherein the polyelectrolyte has a molecular weight of about 100–1,000,000, and is selected from the group consisting of poly (acrylic acid), poly (methacrylic acid), poly (methyl methacrylic acid), poly (maleic acid), poly (vinyl sulfonic acid), poly (acrylic acid-co-maleic acid), poly (vinyl amine), poly (ethylenimine), poly (4-vinyl pyridine), poly (amino acid), salts thereof, and esters thereof.

16. The pad of claim 12 wherein the abrasive particles comprise at least one member selected from the group consisting of ceria, silica, alumina, zirconia, titania, and rare earth oxides other than ceria, and the binder material comprises a polymer resin.

17. The pad of claim 12 wherein the abrasive particles have an average particle size of about 1–20,000 nm, and the binder material comprises a polymer resin selected from the group consisting of amino resins, acrylate resins, alkyd resins, polyester resins, urethane resins, phenolic resins, epoxy resins, isocyanate resins, isocyanurate resins, polysiloxane resins, polyimide resins, vinyl resins, urea-formaldehyde resins, melamine-formaldehyde resins, styrene resins, vinyl toluene resins, divinyl benzene resins, and mixtures thereof.

18. A polishing pad for chemical mechanical polishing of a surface of a semiconductor wafer, comprising a sheeting material having a support surface coated with a polishing layer comprising friction erodible binder material containing substantially uniformly distributed therein both a plurality of abrasive particles comprising ceria having an average particle size of about 1–20,000 nm and a water soluble ionizable polyelectrolyte;

wherein the polyelectrolyte contains an ionizable group selected from the group consisting of acidic groups, basic groups, and both acidic groups and basic groups; and wherein, by weight, the abrasive particles are present in an amount of about 50–500 parts per 100 parts of the binder material, and the polyelectrolyte is present in an amount of about 50–200 parts per 100 parts of the abrasive particles.

19. The pad of claim 18 wherein the polyelectrolyte has a molecular weight of about 100–1,000,000, and is selected from the group consisting of poly (acrylic acid), poly (methacrylic acid), poly (methyl methacrylic acid), poly (maleic acid), poly (vinyl sulfonic acid), poly (acrylic acid-co-maleic acid), poly (vinyl amine), poly (ethylenimine), poly (4-vinyl pyridine), poly (amino acid), salts thereof, and esters thereof.

20. The pad of claim 18 wherein the binder material comprises a polymer resin selected from the group consisting of amino resins, acrylate resins, alkyd resins, polyester resins, urethane resins, phenolic resins, epoxy resins, isocyanate resins, isocyanurate resins, polysiloxane resins, polyimide resins, vinyl resins, urea-formaldehyde resins, melamine-formaldehyde resins, styrene resins, vinyl toluene resins, divinyl benzene resins, and mixtures thereof.

* * * * *

UNITED STATES PATENT AND TRADEMARK OFFICE
CERTIFICATE OF CORRECTION

PATENT NO. : 7,011,574 B2 Page 1 of 1
APPLICATION NO. : 10/996669
DATED : March 14, 2006
INVENTOR(S) : Simpson et al.

It is certified that error appears in the above-identified patent and that said Letters Patent is hereby corrected as shown below:

<u>Column 23,</u>
Line 67, delete "melaniine" and insert -- melamine --.

Signed and Sealed this

Twentieth Day of June, 2006

JON W. DUDAS
*Director of the United States Patent and Trademark Office*